(12) United States Patent
Naito (10) Patent No.: US 7,269,082 B2
(45) Date of Patent: Sep. 11, 2007

(54) CHIP ENABLE CONTROL CIRCUIT, MEMORY CONTROL CIRCUIT, AND DATA PROCESSING SYSTEM

(75) Inventor: Koji Naito, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 12 days.

(21) Appl. No.: 11/378,391

(22) Filed: Mar. 20, 2006

(65) Prior Publication Data

US 2006/0245275 A1 Nov. 2, 2006

(30) Foreign Application Priority Data

Apr. 14, 2005 (JP) .............................. 2005-116704

(51) Int. Cl.
*G11C 7/00* (2006.01)
(52) U.S. Cl. ................. 365/191; 365/227; 365/189.09; 365/194; 365/189.07
(58) Field of Classification Search ................ 365/191, 365/227, 189.09, 194, 189.07
See application file for complete search history.

(56) References Cited

U.S. PATENT DOCUMENTS

| | | | | |
|---|---|---|---|---|
| 5,134,586 A | * | 7/1992 | Steele | 365/201 |
| 5,303,181 A | * | 4/1994 | Stockton | 365/96 |
| 5,349,565 A | * | 9/1994 | Wu et al. | 365/230.08 |
| 5,422,855 A | * | 6/1995 | Eslick et al. | 365/226 |
| 5,798,980 A | * | 8/1998 | McClure | 365/233 |
| 6,009,494 A | * | 12/1999 | Pawlowski | 365/230.03 |
| 7,224,623 B2 | * | 5/2007 | Partsch et al. | 365/189.05 |

FOREIGN PATENT DOCUMENTS

JP 08-076875 3/1996

* cited by examiner

*Primary Examiner*—Tuan T. Nguyen
(74) *Attorney, Agent, or Firm*—Rabin & Berdo, P.C.

(57) ABSTRACT

A CE control circuit includes a CE signal generating circuit which sets a CE signal to an enable level when bringing the memory to an operable state or sets the CE signal to a disable level when bringing the memory to a low power consumption state, and a reference value generating circuit which outputs a reference value corresponding to a period during which the memory is allowed to be continuously in the operable state, wherein when not receiving a startup request signal of the memory for a period during which the CE signal is the enable level, the CE signal generating circuit elongates the period during which the CE signal is the enable level to a period corresponding to the reference value and which is not shorter than a CE enable signal hold time of the memory, and sets the CE signal to the disable level after the elongated period passes.

10 Claims, 12 Drawing Sheets

| TABLE 17 | |
|---|---|
| TIMER VALUE (TIMER) | EXPECTED VALUE (EV) |
| FROM 0 TO LESS THAN 12 | E1 |
| FROM 12 TO LESS THAN 16 | E2 |
| NOT LESS THAN 16 | E3 |
| E1 < E2 < E3 | |

CHIP ENABLE CONTROL CIRCUIT, MEMORY CONTROL CIRCUIT, AND DATA PROCESSING SYSTEM

BACKGROUND OF THE INVENTION

1. Field of the Invention

The present invention relates to a chip enable control circuit which controls a chip enable (CE) signal for a memory in a system including the memory and a central processing unit (CPU) with a cache memory, a memory control circuit which includes the chip enable control circuit, and a data processing system which includes the memory control circuit.

2. Description of the Related Art

A system which includes a CPU with a cache memory and a flash memory is disclosed in, for example, the Japanese Patent Application Kokai (Laid-Open) Publication No. 8-76875 (patent document 1).

Figure 11:
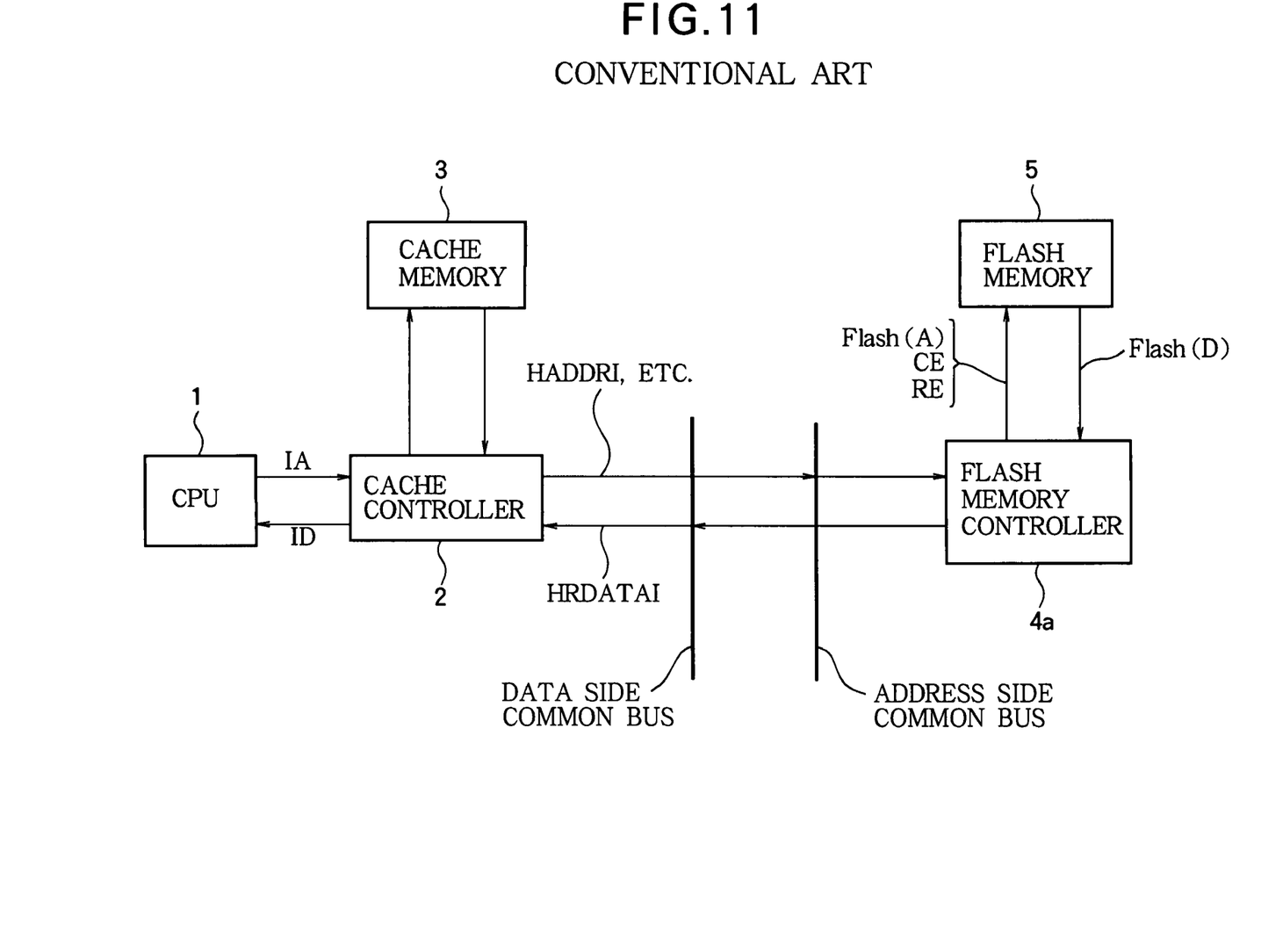
FIG. 11 is a block diagram schematically showing the construction of a conventional system.

FIG. 11 is a block diagram showing the construction of a conventional system which includes a CPU 1, a cache controller 2, a cache memory 3, a flash memory controller 4a, and a flash memory 5. In this system, the CPU 1 fetches code data from the cache memory 3 via the cache controller 2 or code data from a common bus, and performs an operation according to the fetched code data and other operation. When the CPU 1 reads a code from a common memory, the cache controller 2 generates a signal HADDRI indicating an address of the flash memory 5, a signal HTRANSI indicating whether an address is an enable level or disable level, and a signal HBURSTI indicating the number of transfers, and outputs them to the address side common bus.

Figure 12:
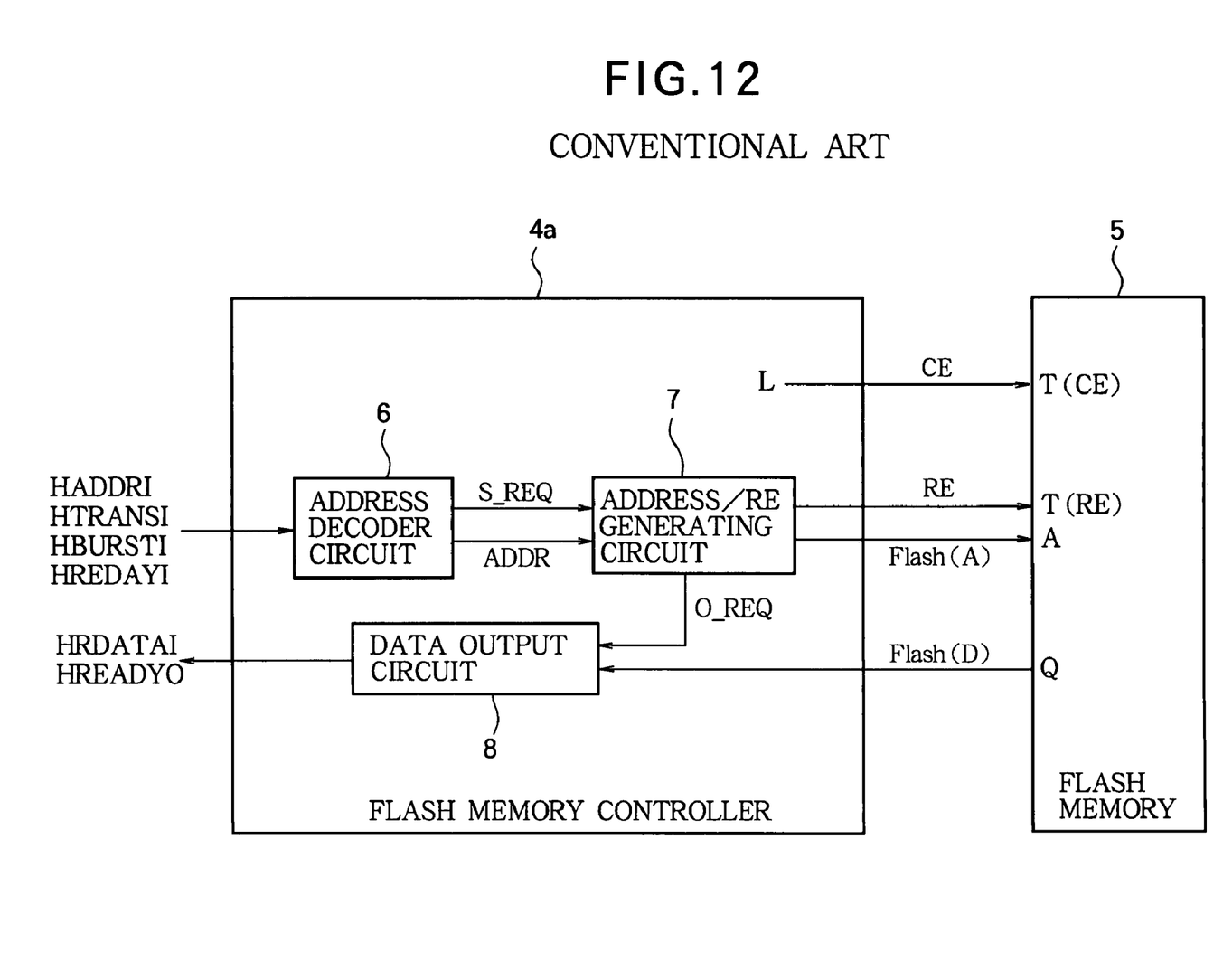
FIG. 12 is a block diagram schematically showing the construction of a conventional flash memory controller.

FIG. 12 is a block diagram showing the construction of a conventional flash memory controller 4a. The flash memory controller 4a includes an address decoder circuit 6, an address/read enable (RE) generating circuit 7, and a data output circuit 8. The address decoder circuit 6 receives the signals HADDRI, HTRANSI, HBURSTI, and HREADYI (which indicates the end of transfer of a previous cycle) of the address side common bus, and outputs a startup request signal S_REQ and an address ADDR. The address/RE generating circuit 7 receives the startup request signal S_REQ and the address ADDR, outputs a read enable signal (RE signal) and an address signal Flash(A) to the flash memory 5, and outputs an output request signal O_REQ to the data output circuit 8. In FIG. 12, the input terminal T(CE) for a CE signal of the flash memory 5 is connected to an L level (GND), and the flash memory 5 is brought to an operable state (activated state). The output request signal O_REQ outputted from the address/RE generating circuit 7 and data Flash(D) outputted from the flash memory 5 are inputted to the data output circuit 8. The data output circuit 8 outputs a signal HRDATAI to the data side common bus and outputs a signal HREADYO to the address side common bus.

Figure 13:
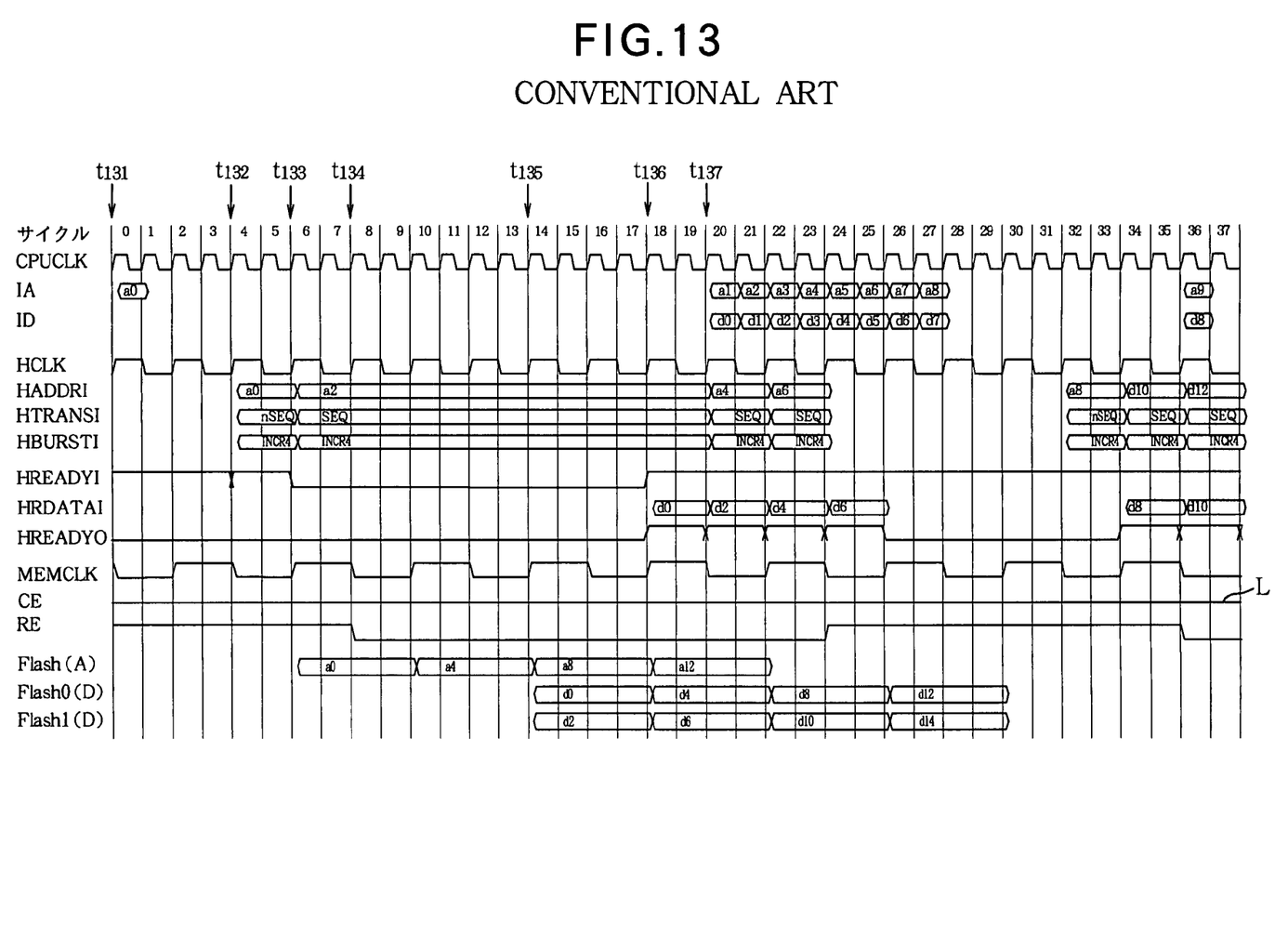
FIG. 13 is a diagram showing operating waveforms when a cache miss occurs (without CE control)

FIG. 13 is a diagram showing operating waveforms when a cache miss hit occurs in the above-mentioned conventional system, i.e., in a case where a CE signal is always an enable level (set to L level) and CE control is not performed. In FIG. 13, CPUCLK denotes the operating clock of the CPU 1, HCLK denotes a clock generated by the CPU 1, MEMCLK denotes an operating clock of the flash memory 5, and Flash0 (D) and Flash1 (D) denote data outputted from the flash memory 5. When an address IA is outputted from the CPU 1 (time $t_{131}$), the cache controller 2 outputs signals HADDRI, HTRANSI, and HBURSTI to the address side common bus (time $t_{132}$). When the signals HADDRI, HTRANSI, HBURSTI, and HREADYI are signals to be used for accessing the flash memory 5, the address decoder circuit 6 of the flash memory controller 4a generates a startup request signal S_REQ in synchronization with the clock HCLK by the use of the signals HADDRI, HTRANSI, HBURSTI, and HREADYI, and holds the signal HADDRI which is an address value of the flash memory 5. The address/RE generating circuit 7 receives the startup request signal S_REQ and the held address value HADDRI, and generates an address Flash(A) and an RE signal (times $t_{133}$, $t_{134}$). The flash memory 5 outputs data Flash(D) relating to the address Flash(A) in synchronization with the clock MEMCLK (time $t_{135}$). The data output circuit 8 waits for an output request (O_REQ in FIG. 12) generated by the address/RE generating circuit 7, and outputs the data HRDATAI relating to the output request to the common bus (time $t_{136}$). The data HRDATAI outputted to the common bus is inputted as data ID to the CPU 1 via the cache controller 2 (time $t_{137}$)

However, since the conventional flash memory controller 4a shown in FIG. 12 does not perform the CE control, i.e., the CE terminal T(CE) of the flash memory 5 is connected to the ground (GND), the flash memory 5 is activated even for such a period of cache hit which is a period during which the data of the flash memory 5 is not used, which results in raising the problem of causing an increase in power consumption.

Moreover, when an already-existing CE control is applied to the conventional flash memory controller 4a shown in FIG. 12, there is presented a problem that an increase in cycle at the time of cache miss hit markedly degrades the performance of the system. This problem will be described below.

Figure 14:
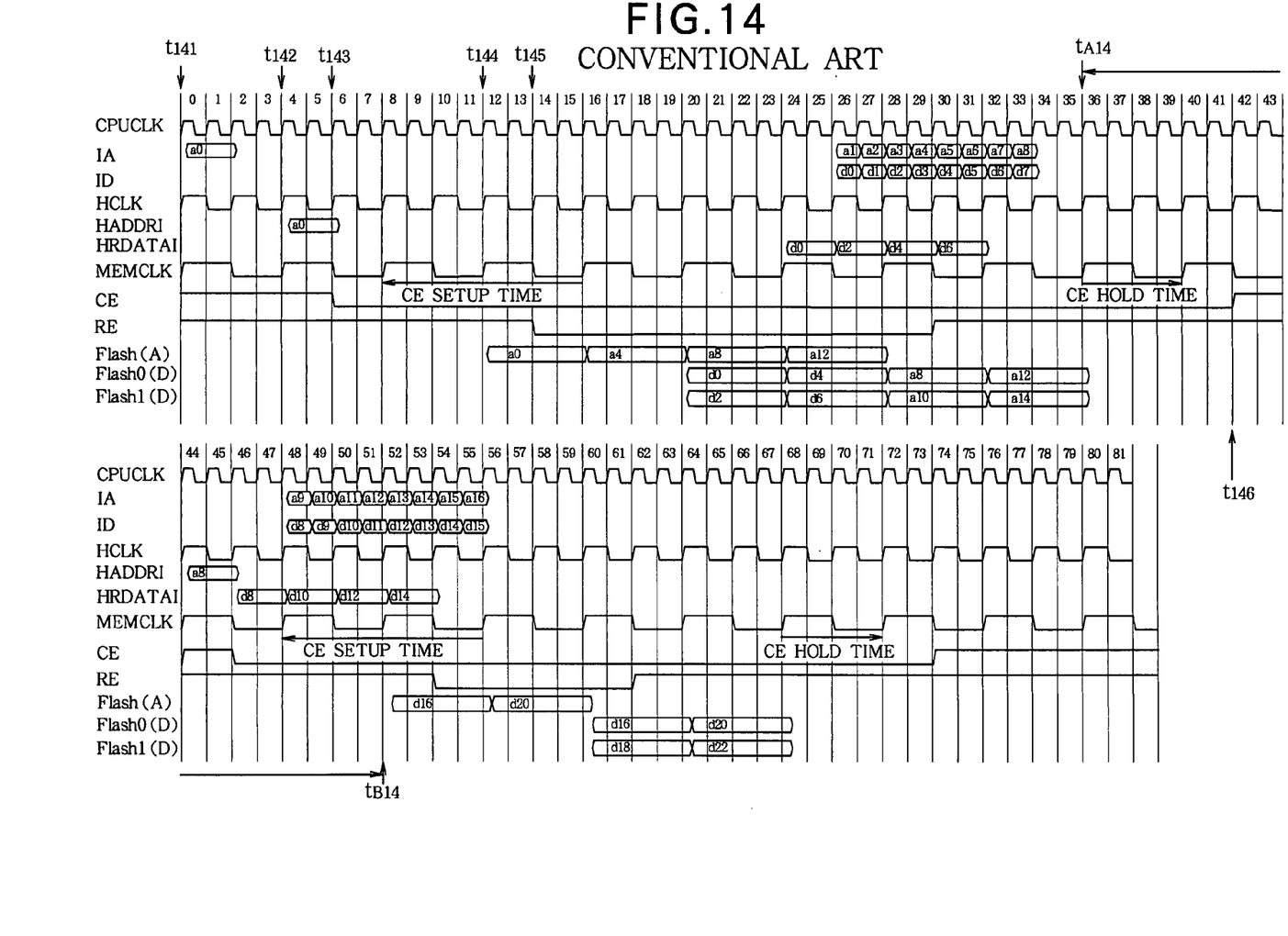
FIG. 14 is a diagram showing operating waveforms when a cache miss occurs (with CE control).

FIG. 14 is a diagram for describing a degradation in the performance of the system and is a diagram showing operating waveforms at the time of cache miss hit in the conventional system, to which an already-existing CE control for changing the CE signal in FIG. 12 to an L level (enable level) or an H level (disable level) is applied. As shown in FIG. 14, if an address IA(a0) is outputted when the CE signal of the flash memory 5 is the H level, i.e., in the mode of low power consumption (time $t_{141}$), the cache controller 2 outputs the signals HADDRI(a0) and other signals (time $t_{142}$), and the flash memory controller 4a sets the CE signal to the L level (enable level) (time $t_{143}$), supplies the flash memory 5 with an address Flash(A) (time $t_{144}$), and sets the RE signal to the L level (read enable) (time $t_{145}$). However, in order to enable the flash memory 5 to be used after the CE signal inputted to the flash memory 5 is set to the L level (time $t_{143}$), it is necessary to wait for the CE setup time of the flash memory 5 to pass. Therefore, as in the case of the already-existing CE control, when the flash memory controller 4a sets the flash memory 5 to the low power consumption mode (i.e., sets CE signal to the H level) every time a cache hit occurs, it is necessary to wait for the CE setup time of the flash memory 5 to pass every time a cache miss hit occurs. This becomes the cause of degrading the performance of the system.

SUMMARY OF THE INVENTION

The object of the present invention is to provide a chip enable control circuit, a memory control circuit, and a data processing circuit which can reduce power consumption without degrading the performance of a system.

According to the present invention, a chip enable control circuit includes: a chip enable signal generating circuit which generates a chip enable signal for controlling a state of a memory, the chip enable signal generating circuit setting the chip enable signal to an enable level when bringing the memory to an operable state in which the memory is operable, the chip enable signal generating circuit setting the chip enable signal to a disable level when bringing the memory to a low power consumption state in which power consumption is lower than in the operable state; and a reference value generating circuit which outputs a reference value corresponding to a period during which the memory is allowed to be continuously in the operable state. When the chip enable signal generating circuit does not receive a startup request signal of the memory for a period during which the chip enable signal is the enable level, the chip enable signal generating circuit elongates the period during which the chip enable signal is the enable level to a period corresponding to the reference value and which is not shorter than a chip enable signal hold time of the memory, and sets the chip enable signal to the disable level after the elongated period passes.

According to another aspect of the present invention, a memory control circuit includes: the above-mentioned chip enable control circuit; an address decoder circuit which receives a memory access signal and generates the startup request signal in accordance with the received memory access signal; and a read enable signal generating circuit which generates the read enable signal in accordance with the startup request signal.

According to yet another aspect of the present invention, a data processing system includes: a central processing unit; a cache memory; a cache controller for controlling operation of the cache memory; a memory; and the above-mentioned memory control circuit, which controls operation of the memory in accordance with a command from the cache controller.

In the present invention, when chip enable signal generating circuit does not receive a startup request signal of a memory for a period during which a chip enable signal is the enable level, the chip enable signal generating circuit elongates the period during which the chip enable signal is the enable level to a period, which corresponds to a reference value relating to a period during which the memory is allowed to be continuously in an operable state and is not shorter than a chip enable signal hold time of the memory, and brings the chip enable signal to the disable level after the elongated period passes. With this control, the memory is not brought to a low power consumption state more than necessary. Therefore, it is possible to generate the effect of being able to avoid a degradation in the performance of the system. Moreover, by performing the control of disabling the chip enable signal, it is possible to generate the effect of realizing low power consumption.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

Figure 1:
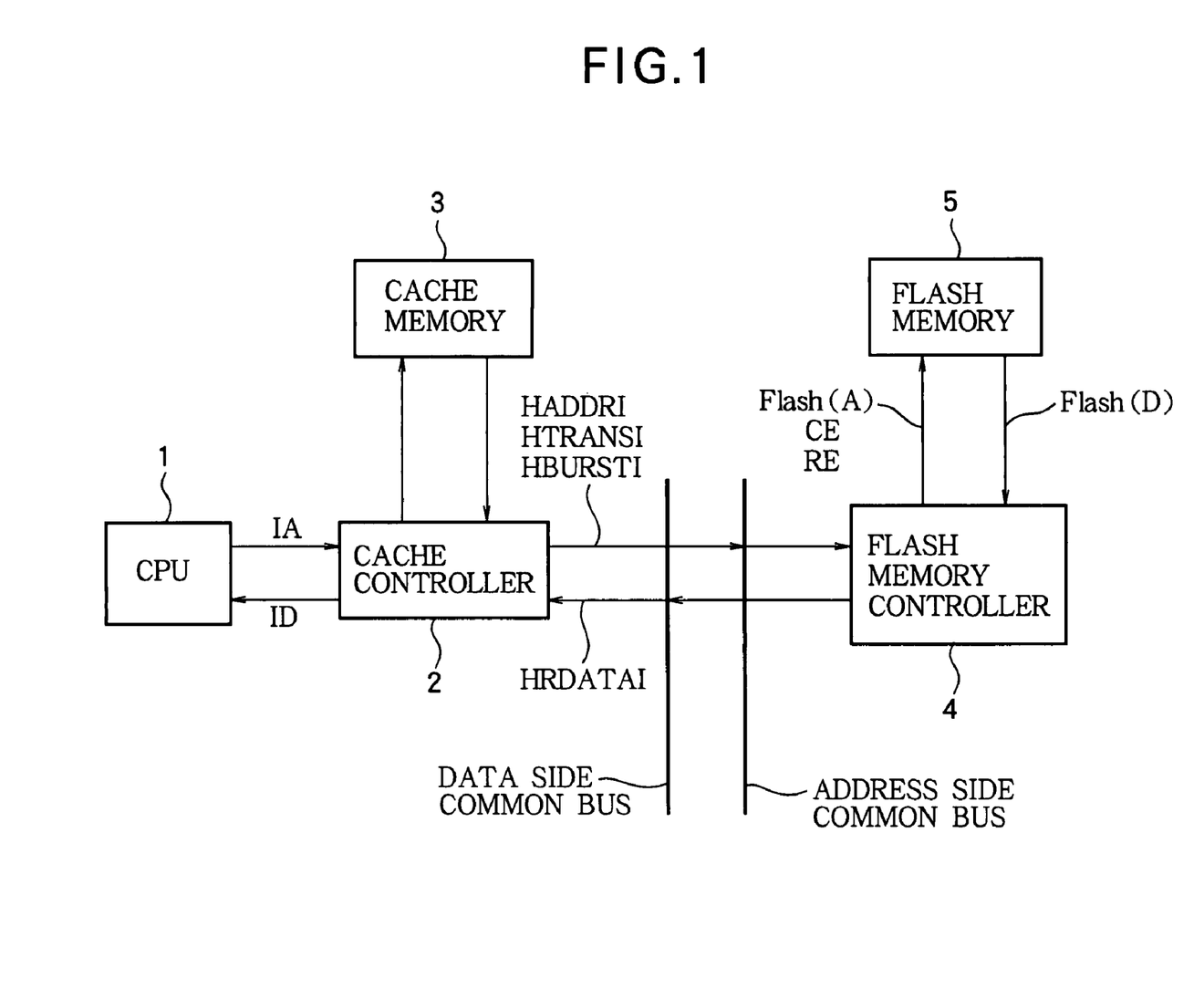
FIG. 1 is a block diagram schematically showing the construction of a data processing system of the present invention.

FIG. 1 is a block diagram showing the construction of a data processing system, to which a CE control circuit according to the first embodiment of the present invention is applied. As shown in FIG. 1, the data processing system includes a CPU 1, a cache controller 2, a cache memory 3, a flash memory controller 4, and a flash memory 5. The CPU 1 fetches code data from the cache memory 3 via the cache controller 2 or code data from a common bus, and performs an operation in accordance with the fetched code data and other operation. When the CPU 1 reads a code from a common memory, which is a memory connected to the common bus and includes the flash memory 5, the cache controller 2 generates a signal HADDRI indicating the address of the flash memory 5, a signal HTRANSI indicating whether an address is an enable level or disable level, and a signal HBURSTI indicating the number of transfers, and outputs them to the address side common bus.

Figure 2:
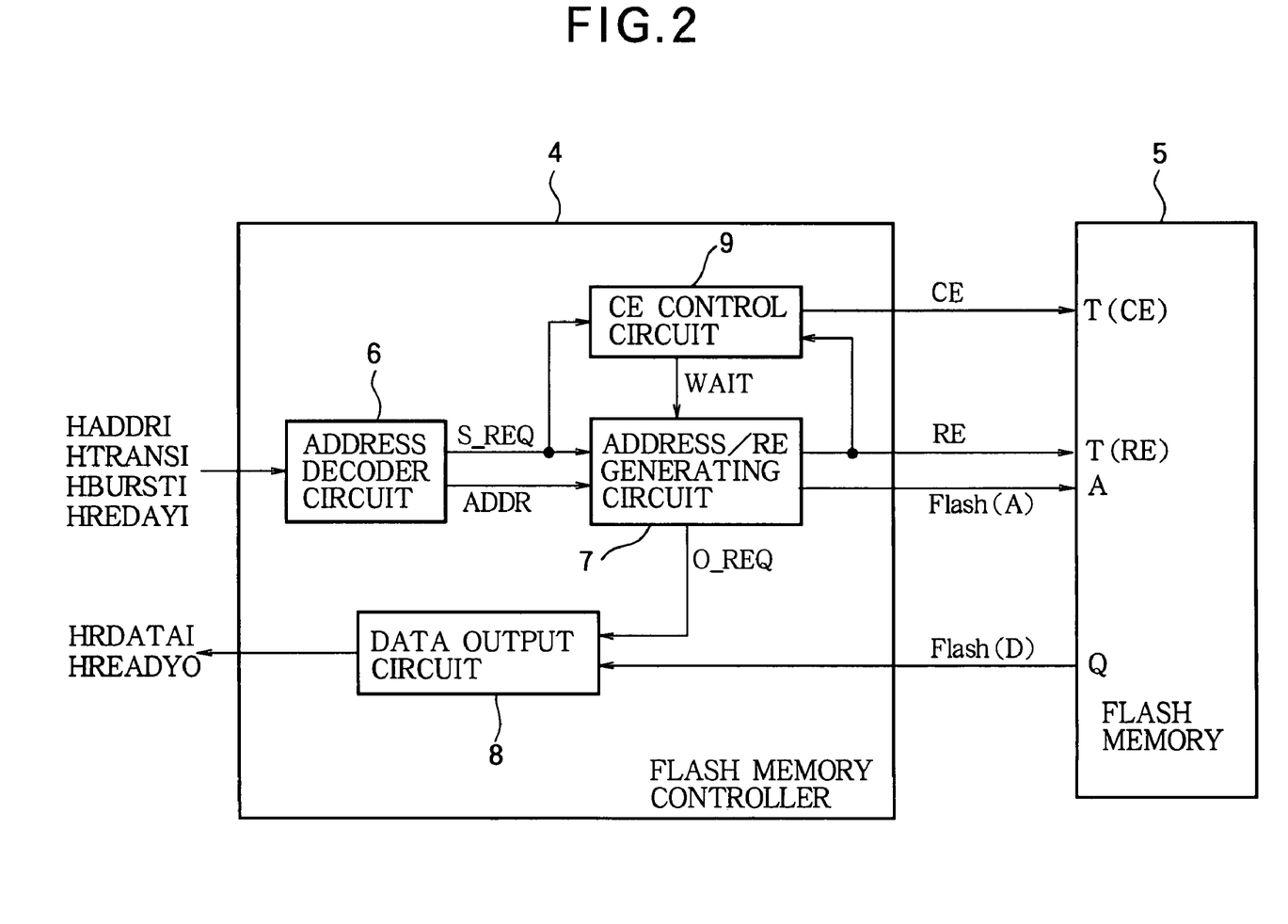
FIG. 2 is a block diagram schematically showing the construction of a flash memory controller which is a memory control circuit in the first embodiment of the present invention.

FIG. 2 is a block diagram showing the construction of the flash memory controller 4 shown in FIG. 1. As shown in FIG. 2, the flash memory controller 4 includes an address decoder circuit 6, an address/read enable (RE) generating circuit 7, a data output circuit 8, and a CE control circuit 9.

The address decoder circuit 6 receives the signals HADDRI, HTRANSI, and HBURSTI of the address side common bus and a signal HREADYI indicating the end of transfer of a previous cycle, outputs a startup request signal S_REQ to the address/RE generating circuit 7 and the CE control circuit 9, and outputs an address ADDR to the address/RE generating circuit 7. The address/RE generating circuit 7 receives the startup request signal S_REQ and the address ADDR from the address decoder circuit 6, receives a wait signal WAIT from the CE control circuit 9, outputs a read enable signal (RE signal) and an address signal Flash(A) to the flash memory 5, and outputs an output request signal O_REQ to the data output circuit 8. The output request signal O_REQ outputted from the address/RE generating circuit 7 and data Flash(D) outputted from the flash memory 5 are inputted to the data output circuit 8. The data output circuit 8 outputs a signal HRDATAI to the data side common bus and outputs a signal HREADYO to the address side common bus.

Figure 3:
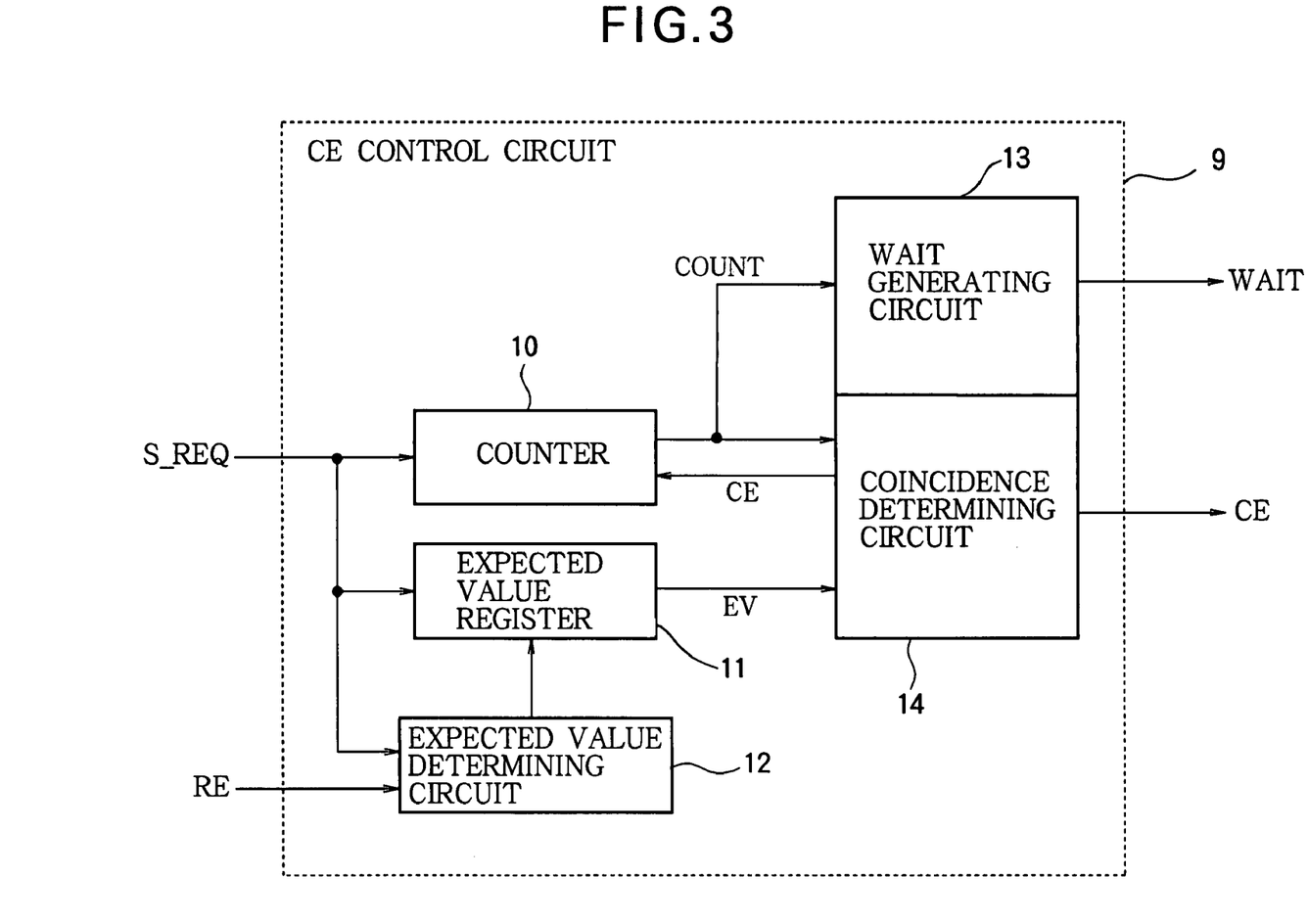
FIG. 3 is a block diagram schematically showing the construction of a CE control circuit in the first embodiment.

FIG. 3 is a block diagram showing the construction of the CE control circuit 9 shown in FIG. 2. As shown in FIG. 3, the CE control circuit 9 includes a counter 10 for outputting a count value COUNT, an expected value register 11 for outputting an expected value EV, an expected value determining circuit 12 for generating the expected value EV, a wait generating circuit 13 for outputting a wait signal WAIT, which is a signal to enable an RE signal, to the address/RE generating circuit 7, and a coincidence determining circuit 14 for outputting a CE signal of a level (enable level or disable level) based on the count value COUNT and the expected value EV.

Figure 4:
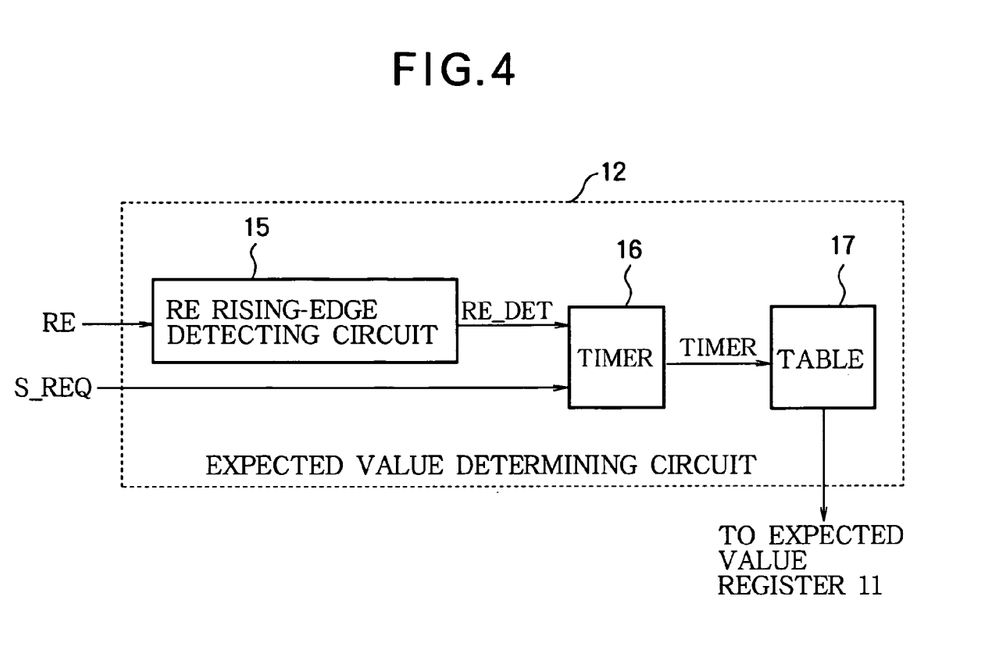
FIG. 4 is a block diagram schematically showing the construction of an expected value determining circuit in the first embodiment.

FIG. 4 is a block diagram showing the construction of the expected value determining circuit 12 shown in FIG. 3. As shown in FIG. 4, the expected value determining circuit 12 includes an RE rising-edge detecting circuit 15 which detects a rising-edge in the RE signal and outputs an RE rising-edge detecting signal (pulse signal) RE_DET, a timer 16 which resets a timer value TIMER by the input of the RE rising-edge detecting signal RE_DET and stops operation by the input of the startup request signal S_REQ, and a table holding section 17 which contains the relationship between the timer value TIMER and the expected value EV.

Figure 5:
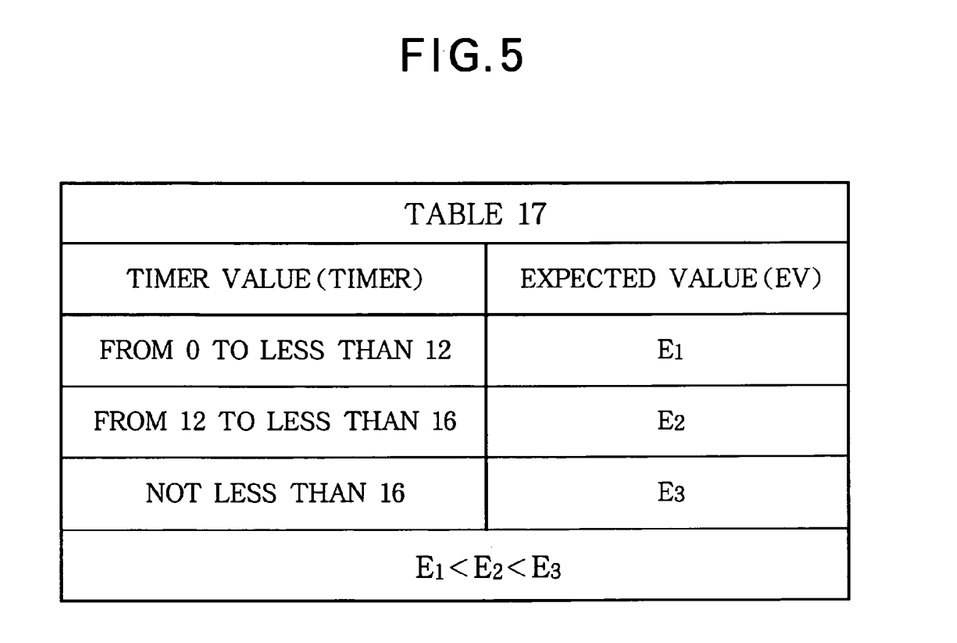
FIG. 5 is a diagram showing a table containing a timer value outputted from a timer and an expected value.
Figure 6:
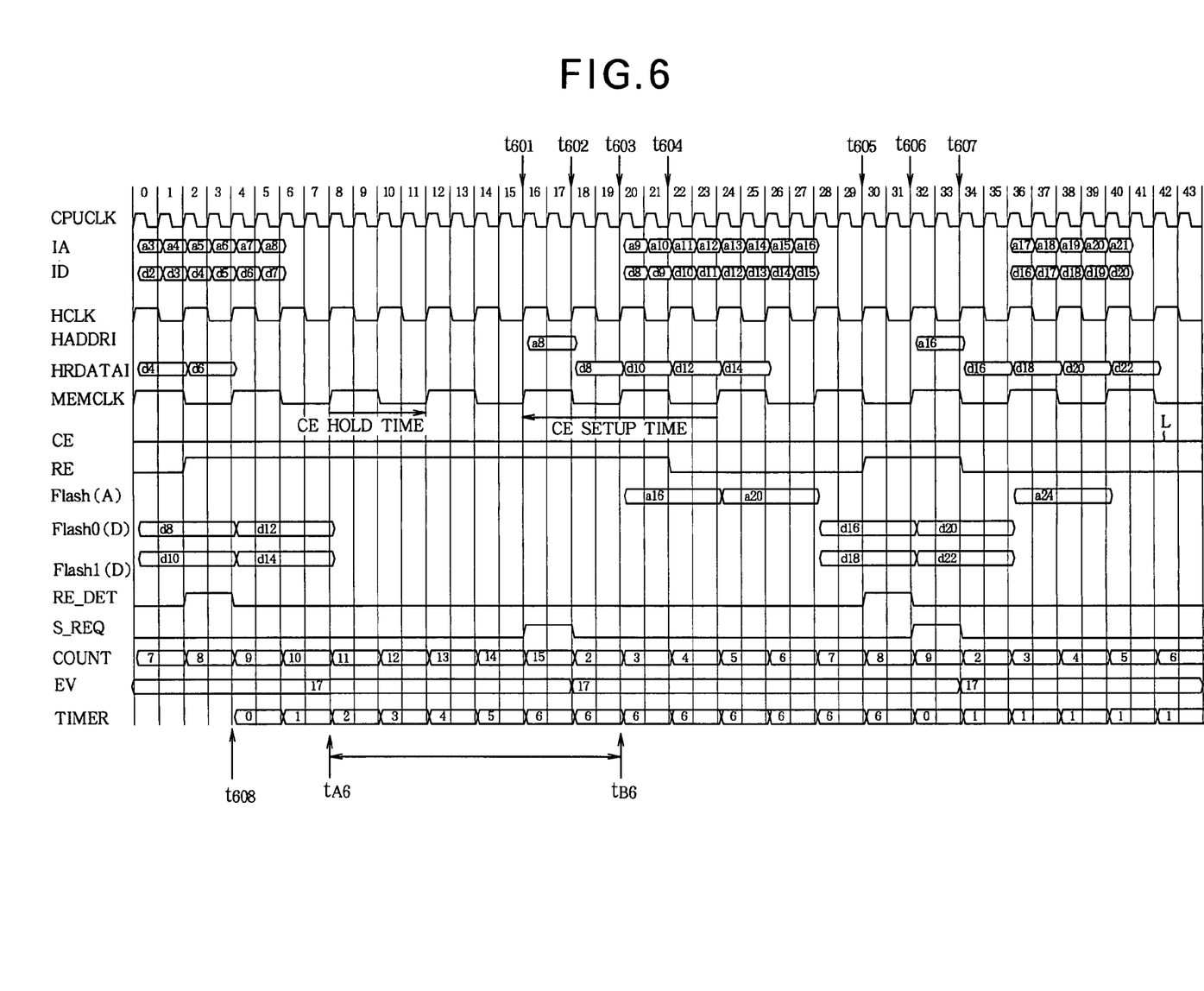
FIG. 6 is a diagram showing operating waveforms of the first embodiment.

FIG. 5 is a diagram showing one example of a table which is held by the table holding section 17 shown in FIG. 4. The table holding section 17 has the data of the expected value EV relating to the timer value TIMER and outputs a value relating to the timer value TIMER to the expected value register 11. For example, as shown in FIG. 6, which will be described later, when a timer value TIMER is relatively small, i.e., when cache misses continuously occur, because a small time value TIMER means that the startup request signal S_REQ of the flash memory 5 is frequently received, the table holding section 17 outputs a minimum cycle ("17" in this case). In FIG. 5, $E_1$, $E_2$, and $E_3$ are reference values relating to periods during which the flash memory 5 is allowed to be continuously in an operable state. The reference values $E_1$, $E_2$, and $E_3$ satisfy an inequality of $E_1<E_2<E_3$ and, for example, $E_1$ is set to "17", $E_2$ is set to "26", and $E_3$ is set to "30".

Next, the operations of the CE control circuit 9, the flash memory controller 4, and the data processing system according to the first embodiment will be described. FIG. 6 is a diagram showing operating waveforms (No. 1) of the first embodiment. FIG. 6 shows a case where a period from the end of a previous cycle to the start of the next cycle is short.

When the cache controller 2 outputs the signals HADDRI, HTRANSI (not shown in FIG. 6), HBURSTI (not shown in FIG. 6), and HREADYI (not shown in FIG. 6) to the address side common bus in accordance with a command from the CPU 1 (time $t_{601}$), in the flash memory controller 4, the address decoder circuit 6 outputs the startup request signal S_REQ to the address/RE generating circuit 7 and the CE control circuit 9 (time t601), and outputs the address ADDR to the address/RE generating circuit 7.

In the flash memory controller 4, the CE control circuit 9 receives the startup request signal S_REQ (H level) from the address decoder circuit 6 (time $t_{601}$), and sets an initial value in the counter 10 in the CE control circuit 9. This initial value is a status value varying in accordance with the state of the flash memory 5. When the flash memory 5 is in a low power consumption mode, i.e., when the CE signal is an H level (disable level), the initial value is set to, for example, "0". When the flash memory 5 is in an operation mode, i.e., when the CE signal is an L level (enable level), the initial value is set to, for example, "2". In an example shown in FIG. 6, the initial value of the counter 10 is set to "2" (times $t_{602}$, $t_{607}$).

In the example shown in FIG. 6, a value relating to the timer value TIMER outputted from the timer 16 in the expected value determining circuit 12 is set in the expected value register 11 in the CE control circuit 9 (time $t_{602}$). This value relating to the timer value TIMER is a value (expected value EV) which is selected in the table holding section 17 as a value relating to a time period, during which the flash memory 5 is allowed to be continuously in an operating state (FIG. 5). Since the timer value TIMER when the startup request signal S_REQ (H level) is received at time $t_{601}$ is "6", $E_1$ ("17" in FIG. 6) is set as the expected value EV from the table in FIG. 5.

When the expected value EV is set in the expected value register 11 (time $t_{602}$), the expected value EV ("17" in FIG. 6) does not coincide with the counter value COUNT ("2" in FIG. 6), and hence the coincidence determining circuit 14 outputs the L level (enable level) as a CE signal (time $t_{602}$). In the example in FIG. 6, the CE signal is the L level before time $t_{602}$, and hence the CE signal is not changed at time $t_{602}$ but keeps the L level.

Every time the clock HCLK rises, the count value COUNT of the counter 10 is incremented by one. For example, when the counter value COUNT of the counter 10 becomes "3" or more ("3" is a specified set value) (time $t_{603}$), a wait signal WAIT (shown in FIG. 2 and FIG. 3) is released, the address/RE generating circuit 7 is started, and the RE signal becomes an L level (read enable) (time $t_{604}$).

In the CE control circuit 9, when the counter value COUNT of the counter 10 coincides with the expected value EV outputted from the expected value register 11, the coincidence determining circuit 14 outputs the H level (disable level) as the CE signal and the counter 10 stops operation. This state is shown, for example, after time $t_{701}$ in FIG. 7, which will be described later, and in this state, the counter value COUNT becomes "18" and coincides with the expected value EV, and hence the operation of the counter 10 stops.

In the CE control circuit 9, when the startup request signal S_REQ is received from the address decoder circuit 6 while the counter 10 is in operation, the count value COUNT of the counter 10 and the expected value EV outputted from the expected value register 11 are set (times $t_{602}$, $t_{607}$). In the example in FIG. 6, since the CE signal is the L level, the initial value of the count value COUNT is "2" and the expected value is set to "17". Although not shown in FIG. 6, if the startup request signal S_REQ is received when the CE signal is the H level, the initial value of the count value COUNT is "0". This is shown at time $t_{702}$ in FIG. 7, which will be described later.

The started address/RE generating circuit 7 outputs a memory address Flash(A) relating to the held signal HAD-DRI and changes the RE signal to the L level (time $t_{604}$). Then, the address/RE generating circuit 7 changes the RE signal to the H level (read enabled) after four clocks of the clock HCLK (after one transfer) (time $t_{605}$).

The flash memory 5 is pipelined inside and hence needs a setup time of two clocks of the clock MEMCLK for each read cycle so as to initialize itself and to initialize read BIAS and a hold time of one clock of the clock MEMCLK so as to hold data. The flash memory 5 receives the CE signal from the CE control circuit 9. Every time the clock MEMCLK rises, the flash memory 5 initializes itself and the read BIAS. Thereafter, when the clock MEMCLK rises, the flash memory 5 receives the memory address Flash(A) and the RE signal from the address/RE generating circuit 7. Then, after one clock of the clock MEMCLK from the rise of the clock MEMCLK when the flash memory 5 receives the memory address Flash(A), the flash memory 5 outputs the data Flash(D) relating to the memory address Flash(A).

The data output circuit 8 holds the data Flash(D) outputted from the flash memory 5, and outputs data HRDATAI and HREADYO held in accordance with to the timing constraint of the bus.

When the RE signal rises, the expected value determining circuit 12 in the CE control circuit 9 generates one shot pulse (signal of detecting the RE signal) TR_DET by an RE rising-edge detecting circuit 15 and the timer 16 in the expected value determining circuit 12 is reset. Thereafter, every time the clock HCLK rises, the timer 16 counts up the timer value TIMER until the startup request signal S_REQ rises, and when the startup request signal S_REQ rises, the timer 16 stops a counting-up operation. The expected value determining circuit 12 outputs an expected value EV based on the timer value TIMER when the timer 10 stops the counting-up operation. The coincidence determining circuit 14 controls a period during which the CE signal is an enable level (the L level) in accordance with the expected value EV (i.e., a value relating to a period from a time when the RE signal rises to a time when the startup request signal S_REQ is received). In the example in FIG. 6, the coincidence determining circuit 14 receives the startup request signal S_REQ for a period during which the CE signal is an enable level (times $t_{601}$, $t_{606}$), and when the coincidence determining circuit 14 receives the startup request signal S_REQ, the count value COUNT is set to an initial value and the CE signal is kept at the enable level.

Figure 7:
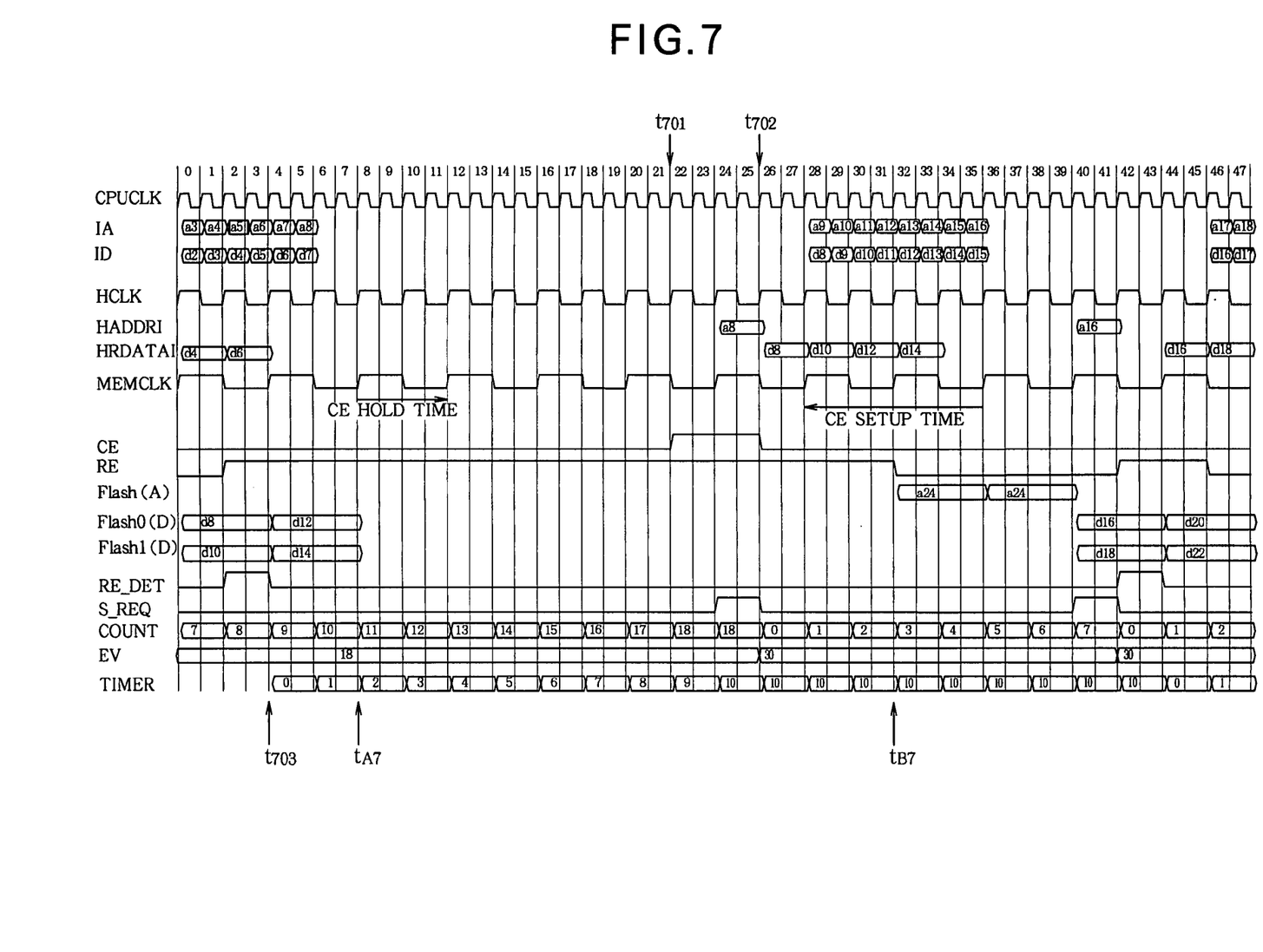
FIG. 7 is a diagram showing other operating waveforms of the first embodiment.

FIG. 7 is a diagram (No. 2) showing operating waveforms of the first embodiment. FIG. 7 shows a case where a period from the end of the previous cycle to the start of the next cycle is long. As shown in FIG. 7, when the timer value is large (in the case of a code in which access or execution cycle after the time when cache hit continues), the table holding section 17 outputs a maximum cycle ("30" in this case). In an example in FIG. 7, at time $t_{701}$, since the CE signal is the H level (disable level) and the flash memory 5 is in the mode of low power consumption, the cycle is increased by a CE setup time. To compensate the increase in the cycle, a maximum value ("30" in this case) is selected from the table holding section 17 in the expected value determining circuit 12 and is outputted as an expected value EV (time $t_{701}$). The coincidence determining circuit 14 controls a period during which the CE signal is the enable level (L level) in accordance with the expected value EV (i.e., value relating to a period from the time when the RE signal rises to the time when the startup request signal S_REQ is received). In the example in FIG. 7, the startup request signal S_REQ is not received for a period during which the CE signal is the enable level (L level) and a period during which the chip enable signal is the enable level is elongated to a period (a period to time $t_{701}$ in FIG. 7), which corresponds to the expected value EV and is longer than a signal hold time (four clocks of CPUCLK) specific to the flash memory 5, and the CE signal is set to the H level (disable level) after the elongated period passes (time $t_{701}$ in FIG. 7).

As described above, in the first embodiment, the CE control circuit 9 measures a period of time from the end of memory access of the previous cycle to the startup of this cycle (a period of time from $t_{A6}$ to $t_{B6}$ in FIG. 6, but the timer measures a period of time from $t_{608}$), and when this period of time is short, the CE control circuit 9 determines that cache miss continues and decreases an expected value EV (for example, the expected value EV is set to "17" at time $t_{602}$ in FIG. 6). Meanwhile, when the period of time from the end of memory access of the previous cycle to the startup of this cycle (a period of time from $t_{A7}$ to $t_{B7}$ in FIG. 7, but the timer measures a period of time from $t_{703}$) is long, the CE control circuit 9 determines that cache miss starts (i.e., cache hit continues and then cache miss occurs) and increases the expected value EV (for example, the expected value EV is set to "30" at time $t_{702}$ in FIG. 7). In this manner, when cache miss starts, the CE control circuit 9 increases the expected value EV to delay the time when the CE signal becomes disable level (H level). Hence, the CE control circuit 9 can decrease frequency with which the CE signal becomes disable level (time $t_{146}$ in FIG. 14) as is the case with the conventional CE control, can save the time required for CE setup, and hence can avoid a degradation in performance of the CPU 1. Specifically, in the case shown in FIG. 14 (conventional case), the period of time from the end of memory access of the previous cycle (time $t_{A6}$) to the startup of this cycle (time $t_{B14}$) is 16 cycles of the CPU clock, but in the case of FIG. 16 (first embodiment), the period of time from the end of memory access of the previous cycle (time $t_{A6}$) to the startup of this cycle (time $t_{B6}$) is 12 cycles of the CPU clock. Hence the degradation in the performance of the CPU 1 can be avoided. Moreover, in the first embodiment, since the control of the CE signal is performed, there is generated the effect of reducing power consumption as compared with the conventional case (FIG. 13) where the CE control is not performed.

Second Embodiment

Figure 8:
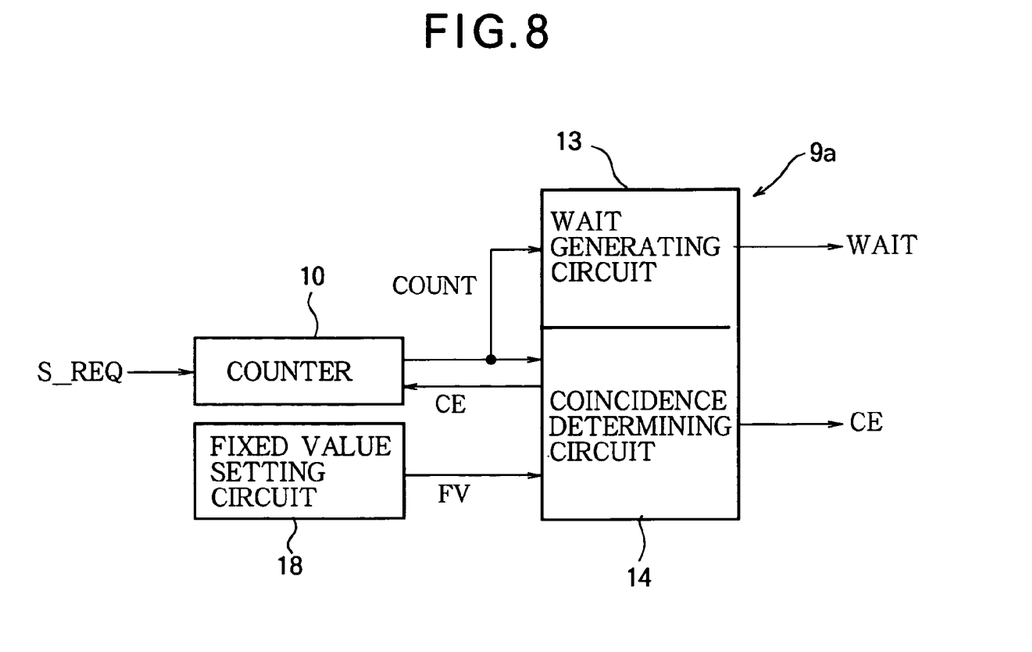
FIG. 8 is a block diagram schematically showing the construction of a CE control circuit in the second embodiment.

FIG. 8 is a block diagram showing the construction of a CE control circuit 9a according to the second embodiment. In FIG. 8, constructions corresponding to the constructions shown in FIG. 3 are denoted by the same reference symbols. The CE control circuit 9a in FIG. 8 is different from the CE control circuit 9 shown in FIG. 3 in that the CE control circuit 9a includes a fixed value setting circuit 18 in place of the expected value register 11 and the expected value determining circuit 12, shown in FIG. 3.

Figure 9:
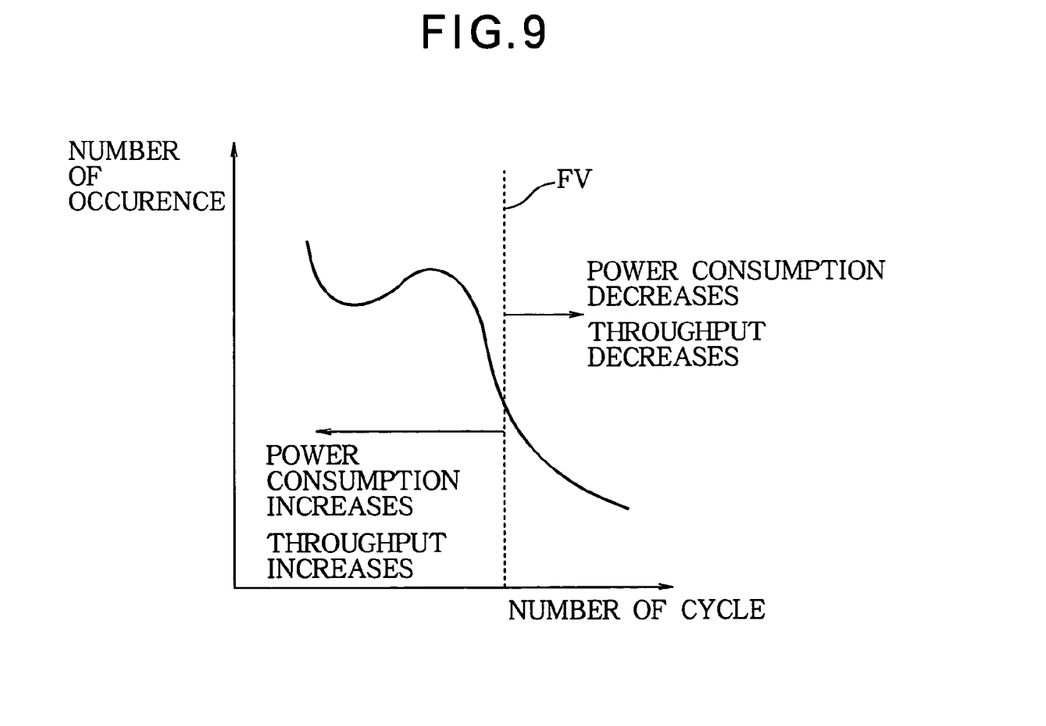
FIG. 9 is a graph showing an example of a cycle distribution of program to be executed.

A fixed value FV outputted from the fixed value setting circuit 18 is determined on a cycle distribution of program executed by the data processing system (FIG. 1) FIG. 9 is a graph showing a cycle distribution obtained by performing simulation calculation. In FIG. 9, a horizontal axis shows the number of cycles which indicates the number of clocks required to perform one data transfer and a vertical axis indicates the number of occurrences of data transfer which requires the each number of cycles. A curve shown in FIG. 9 is only an example and a straight broken line in a vertical direction corresponds to a fixed value FV. In the right region of the straight line FV in FIG. 9, the control in which the CE signal a disable level is performed, and hence the performance of the system is degraded but the effect of decreasing power consumption is increased. In the left region of the straight line FV in FIG. 9, the control in which the CE signal is not disable level is performed, and hence the performance of the system is improved but the effect of decreasing power consumption cannot be realized. Therefore, it is recommended that the value of the fixed value FV is determined in consideration of both of the required performance of the system and a required decrease in power consumption.

Figure 10:
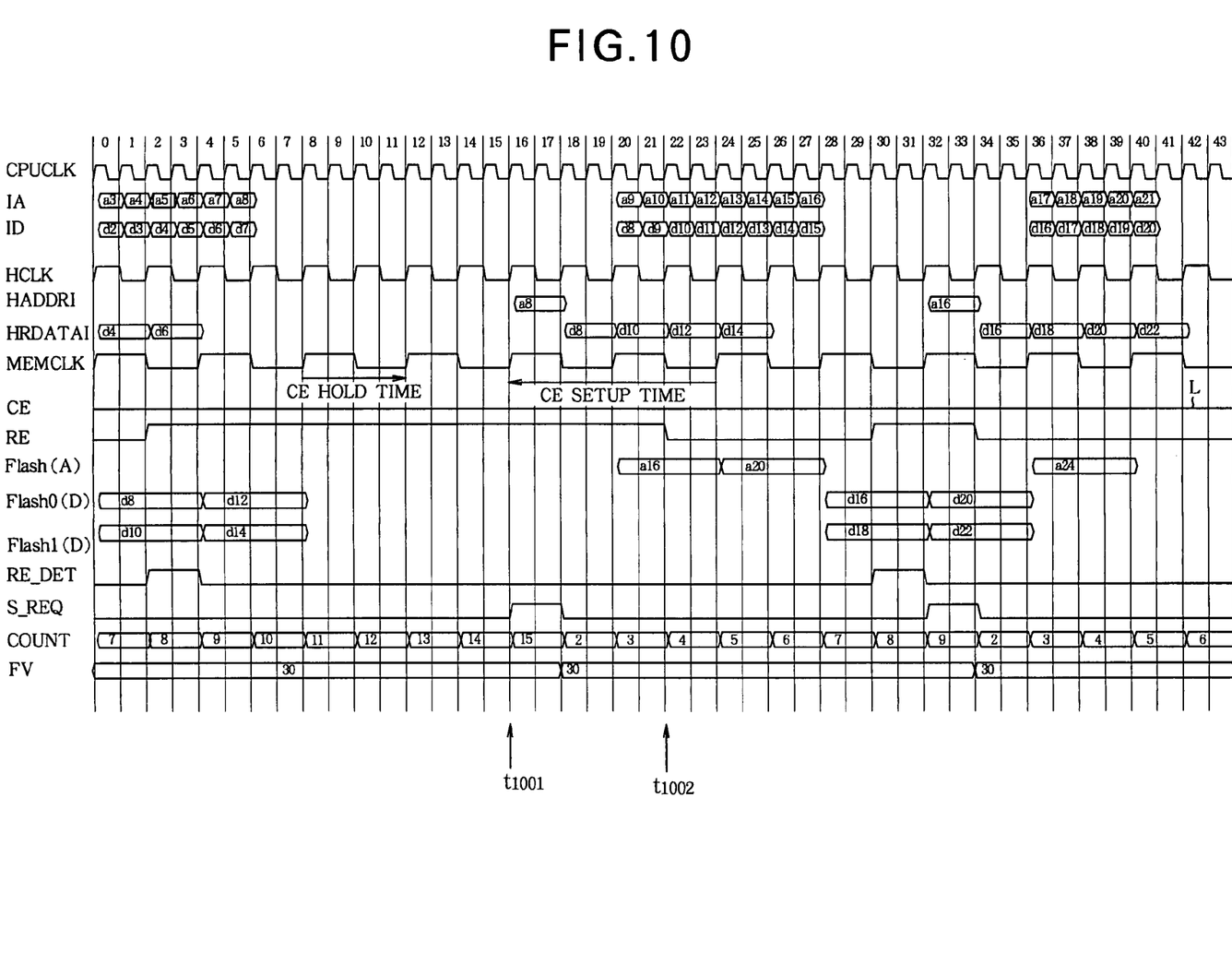
FIG. 10 is a diagram showing operating waveforms of the second embodiment.

FIG. 10 is a diagram showing operating waveforms of the second embodiment. In the CE control circuit 9a, a startup request signal S_REQ is received the address decoder circuit 6, and a count value COUNT is set (time $t_{1001}$). Since the fixed value FV does not coincide with the count value COUNT, the coincidence determining circuit 14 outputs a CE signal of the L level (enable level) (keeps the L level in FIG. 10).

Every time the clock HCLK rises, the count value COUNT is incremented by one. When the count value COUNT becomes three or more, a wait signal WAIT is released (time $t_{1002}$), and the address/RE generating circuit 7 is started to set the RE signal to the L level (read enable) (time $t_{1002}$). When the count value COUNT coincides with the fixed value FV, the coincidence determining circuit 14 sets a CE signal to the H level (disable level) to stop the operation of the counter 10, which is not shown in FIG. 10.

As described above, according to the second embodiment, by determining the width of a period during which the CE signal is the L level in accordance with the cycle distribution of program to be used and by setting the CE signal to the H level only when the number of cycles is not smaller than a specified level (fixed value FV), without degrading the performance of the CPU, it is possible to reduce power consumption and to realize a small-scale circuit and at the same time to generate the effect of reducing power consumption of the circuit and cost.

Except for the above-described points, the second embodiment is the same as the first embodiment.

MODIFIED EXAMPLE

In the first embodiment, the table holding section 17 determines the expected value EV in accordance with the result of one measurement of the timer value TIMER. However, it is also recommendable that the timer value TIMER is measured two or more times to get a plurality of measurement results, the expected value is learned in accordance with the plurality of measurement results by adding or subtracting the plurality of timer values TIMER, and the CE control is performed in accordance with the learned expected value EV.

In the second embodiment has been described a case where not the expected value but the fixed value is used as the reference value of determination to be inputted to the coincidence determining circuit 14. However, by the use of a register, it is also recommendable to manually adjust the reference value of determination to be inputted to the coincidence determining circuit 14 or to set the reference value by the use of software (i.e., to automatically adjust the reference value).

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A chip enable control circuit comprising:
a chip enable signal generating circuit which generates a chip enable signal for controlling a state of a memory, the chip enable signal generating circuit setting the chip enable signal to an enable level when bringing the memory to an operable state in which the memory is operable, the chip enable signal generating circuit setting the chip enable signal to a disable level when bringing the memory to a low power consumption state in which power consumption is lower than in the operable state; and
a reference value generating circuit which outputs a reference value corresponding to a period during which the memory is allowed to be continuously in the operable state;
wherein when the chip enable signal generating circuit does not receive a startup request signal of the memory for a period during which the chip enable signal is the enable level, the chip enable signal generating circuit elongates the period during which the chip enable signal is the enable level to a period corresponding to the reference value and which is not shorter than a chip enable signal hold time of the memory, and sets the chip enable signal to the disable level after the elongated period passes.

2. The chip enable control circuit according to claim 1, wherein when the chip enable signal generating circuit receives the startup request signal for the period during which the chip enable signal is the enable level, the chip enable signal generating circuit keeps the chip enable signal at the enable level.

3. The chip enable control circuit according to claim 1, wherein the reference value generating circuit receives the startup request signal of the memory and a read enable signal of the memory;
wherein the reference value is determined in accordance with an interval from the receipt of the startup request signal to the receipt of the read enable signal.

4. The chip enable control circuit according to claim 1, wherein the reference value generating circuit includes:
a timer which outputs a timer value and resets the timer value when receiving the read enable signal and stops operation when receiving the startup request signal; and
a table hold section which outputs the reference value corresponding to the timer value outputted from the timer.

5. The chip enable control circuit according to claim 1, wherein the reference value generating circuit sets the reference value to a predetermined value.

6. The chip enable control circuit according to claim 5, wherein the reference value generating circuit includes a circuit for adjusting the reference value.

7. The chip enable control circuit according to claim 5, wherein the reference value generating circuit includes a circuit for adjusting the reference value in accordance with previously acquired distribution data of access cycle to the memory.

8. The chip enable control circuit according to claim 1, wherein the chip enable signal generating circuit includes:
a counter having a count value which is reset when receiving the startup request signal of the memory; and a coincidence determining circuit which sets the chip enable signal to the disable level when the count value of the counter coincides with the reference value.

9. A memory control circuit comprising:

the chip enable control circuit of claim 1;

an address decoder circuit which receives a memory access signal and generates the startup request signal in accordance with the received memory access signal; and a read enable signal generating circuit which generates the read enable signal in accordance with the startup request signal.

10. A data processing system comprising:

a central processing unit;

a cache memory;

a cache controller for controlling operation of the cache memory;

a memory; and the memory control circuit of claim 9, which controls operation of the memory in accordance with a command from the cache controller.

* * * * *